United States Patent [19]

Nicolas et al.

[11] Patent Number: 5,124,930
[45] Date of Patent: Jun. 23, 1992

[54] METHOD FOR ANALYZING A SIGNAL BY WAVELETS

[75] Inventors: Jean-Marie Nicolas, Nogent sur Marne; Alain Lemer, Bagneux, both of France

[73] Assignee: Thomson-CSF, Puteaux, France

[21] Appl. No.: 481,336

[22] Filed: Feb. 20, 1990

[30] Foreign Application Priority Data

Mar. 3, 1989 [FR] France ................. 89 02790

[51] Int. Cl.$^5$ ............ G06F 15/336; G01R 23/00
[52] U.S. Cl. ............................ 364/485; 364/728.01
[58] Field of Search ........... 364/485, 486, 484, 421, 364/422, 728.01, 724.12, 728.03, 487

[56] References Cited

U.S. PATENT DOCUMENTS

| | | | |
|---|---|---|---|
| 4,718,104 | 1/1988 | Anderson | 364/724 |
| 4,768,174 | 8/1988 | Castle | 364/421 |
| 4,775,951 | 10/1988 | Iwahashi et al. | 364/728.03 |
| 4,797,860 | 1/1989 | Quaglino | 364/421 |
| 4,837,723 | 6/1989 | Peacock | 364/421 |
| 4,884,247 | 11/1989 | Hadidi et al. | 364/421 |
| 4,974,187 | 11/1990 | Lawton | 364/728.01 |
| 4,980,867 | 12/1990 | Duren et al. | 364/421 |

OTHER PUBLICATIONS

Electronic Week, vol. 57, No 27, Oct. 15, 1984, pp. 61-64, New York, US; M. S. Darlow; "Using personal computers as spectrum analyzers".

Computer, vol. 21, No. 3, Mar. 1988, pp. 11 $\propto$ 22, IEEE, New York, US; T. Kohonen: "The neural phonetic typewriter".

Primary Examiner—Kevin J. Teska
Attorney, Agent, or Firm—Oblon, Spivak, McClelland, Maier & Neustadt

[57] ABSTRACT

To analyze short-duration signals by means of an analysis using MARRAT's algorithm with the wavelets of DAUBECHIES, at each step the correlation is done both on the signals coming from the correlation at the previous step by the scale $\Phi_O$ signal and on the signals coming from the correlation at the preceding step by the signal $\Phi_O$. Thus, at the stage p, there is obtained a homogeneous signal consisting of $2^p \times N^p$ points of analysis. This makes it possible, in the method of analysis by wavelets, to obtain a depiction of the results having a homogeneous form making it easier to interpret them.

6 Claims, 4 Drawing Sheets

| | n | ky(n) | | n | ky(n) | | n | ky(n) |
|---|---|---|---|---|---|---|---|---|
| N = 2 | 0 | .482962913145 | | 4 | -.143906003929 | N = 10 | 0 | .026670057901 |
| | 1 | .836516303738 | | 5 | -.224036184994 | | 1 | .188176800078 |
| | 2 | .224143868042 | | 6 | .071309219267 | | 2 | .527201188932 |
| | 3 | -.129409522551 | | 7 | .080612609151 | | 3 | .688459039454 |
| | | | | 8 | -.038029936935 | | 4 | .281172343661 |
| N = 3 | 0 | .332670552950 | | 9 | -.016574541631 | | 5 | -.249846424327 |
| | 1 | .806891509311 | | 10 | -.012550998556 | | 6 | -.195946274377 |
| | 2 | .459877502118 | | 11 | .000429577973 | | 7 | .127369340336 |
| | 3 | -.135011020010 | | 12 | -.001801640704 | | 8 | .093057364604 |
| | 4 | -.085441273882 | | 13 | .000353713800 | | 9 | -.071394147166 |
| | 5 | .035226291882 | | | | | 10 | -.029457536822 |
| | | | | | | | 11 | .033212674059 |
| N = 4 | 0 | .230377813309 | N = 8 | 0 | .054415842243 | | 12 | .003606553567 |
| | 1 | .714846570553 | | 1 | .312871590914 | | 13 | -.010733175483 |
| | 2 | .630880767930 | | 2 | .675630736297 | | 14 | .001395351747 |
| | 3 | -.027983769417 | | 3 | .585354683654 | | 15 | .001992405295 |
| | 4 | -.187034811719 | | 4 | -.015829105256 | | 16 | -.000685856695 |
| | 5 | .030841381836 | | 5 | -.284015542962 | | 17 | -.000116466855 |
| | 6 | .032883011667 | | 6 | .000472484574 | | 18 | .000093588670 |
| | 7 | -.010597401785 | | 7 | .128747426620 | | 19 | -.000013264203 |
| | | | | 8 | -.017369301002 | | | |
| N = 5 | 0 | .160102397974 | | 9 | -.044088253931 | | | |
| | 1 | .603829269797 | | 10 | .013981027917 | | | |
| | 2 | .724308528438 | | 11 | .008746094047 | | | |
| | 3 | .138428145901 | | 12 | -.004870352993 | | | |
| | 4 | -.242294887066 | | 13 | -.000391740373 | | | |
| | 5 | -.032244869585 | | 14 | .000675449406 | | | |
| | 6 | .077571493840 | | 15 | -.000117476784 | | | |
| | 7 | -.006241490213 | | | | | | |
| | 8 | -.012580751999 | | | | | | |
| | 9 | .003335725285 | N = 9 | 0 | .038077947364 | | | |
| | | | | 1 | .243834674613 | | | |
| N = 6 | 0 | .111540743350 | | 2 | .604823123690 | | | |
| | 1 | .494623890398 | | 3 | .657288078051 | | | |
| | 2 | .751133908021 | | 4 | .133197385825 | | | |
| | 3 | .315250351709 | | 5 | -.293273783279 | | | |
| | 4 | -.226264693965 | | 6 | -.096840783223 | | | |
| | 5 | -.129766867567 | | 7 | .148540749338 | | | |
| | 6 | .097501605587 | | 8 | .030725681479 | | | |
| | 7 | .027522865530 | | 9 | -.067632829061 | | | |
| | 8 | -.031582039318 | | 10 | .000250947115 | | | |
| | 9 | .000553842201 | | 11 | .022361662124 | | | |
| | 10 | .004777257511 | | 12 | -.004723204758 | | | |
| | 11 | -.001077301085 | | 13 | -.004281503682 | | | |
| | | | | 14 | .001847646883 | | | |
| N = 7 | 0 | .077852054085 | | 15 | .000230385764 | | | |
| | 1 | .396539319482 | | 16 | -.000251963189 | | | |
| | 2 | .729132090846 | | 17 | .000039347320 | | | |
| | 3 | .469782287405 | | | | | | |

FIG. 5

METHOD FOR ANALYZING A SIGNAL BY WAVELETS

BACKGROUND OF THE INVENTION

1. Field of the Invention

The present invention pertains to methods for analyzing a signal that enable this signal to be analyzed by using an orthonormal base of functions called wavelets.

2. Description of the Prior Art

There is a very well known way to analyze signals by using either a Fourier series analyisis if this signal is periodic or a Fourier integral if this signal is not periodic. These methods are very powerful but have a number of drawbacks. These drawbacks are especially pronounced for short-duration signals for which these methods are clearly not suitable.

It is known, however, that the short-duration signals form a major part of natural phenomena, especially in the field of sound, where noises of all types rarely last more than some seconds and are often shorter than one second.

Some years ago, Jean MORLET proposed a method of analysis, called the method of analysis by wavelets, which is particularly suited to this field of short-duration signals and notably to pulse noises.

This analysis by wavelets is explained very comprehensively in the journal *Pour La Science*, September 1987. In particular, this document includes an explanation of the reasons for which the Fourier method is ill-suited to short-duration signals.

Given an orthonormal base of wavelets including including $m+1$ wavelets $\Psi_0$ to $\Psi_m$ and a scale $\Phi_m$, the analysis of a signal $S(t)$ takes place in a series of operations shown schematically in FIG. 1: the signal $S(t)$ sampled on N points is convoluted with the set of vectors of the orthonormal base $\Psi_0$ to $\Psi_m$ and by $\Phi_m$. The product of convolution of $S(t)$ by $\Psi_0$ gives N points determining the order 0 wavelet coefficients. The product of convolution of $S(t)$ by $\Psi_1$ gives N points which are the order 1 wavelet coefficients etc., up to the product of convolution of $S(t)$ by $\Psi_m$ which gives the N order m wavelet coefficients. Finally, the product of convolution of $S(t)$ by $\Phi_m$ gives N points which are the order m scale coefficients. It is noted that, to define the analyzed signal, which itself has N points, there are thus N points of analysis obtained. There is thus a redundancy of information which is, however, necessary in this method of analysis used notably with the so-called Haar wavelets.

Ingrid DAUBECHIES, of the AT&T Bell Laboratories at Murray Hill, has computed so-called compact support wavelets which are perfectly adapted to a fast analysis algorithm conceived by Stéphane MALLAT of the University of Pennsylvania.

This algorithm, shown in FIG. 2, also starts from a signal $S(t)$ sampled at N points, but only the wavelet $\Psi_0$ and the scale $\Phi_0$ are used in a series of p successive steps.

In the first step, a product of convolution of $S(t)$ by $\Psi_0$ and by $\Phi_0$ is computed and one in every two of the N points of these products of convolution is selected: this gives twice N/2 points, that is, N points as at the outset. Clearly, this sub-sampling is done more easily by performing only one in two computations when computing the products of convolution.

The N/2 points coming from the product of convolution of S by $\Psi_0$ are memorized, and in a second step, we compute the products of convolution by $\Psi_0$ and by $\Phi_0$ of the N/2 points coming from $\Phi_0$ in the first step by selecting one out of two points of the N/2 points coming from the computation. This second step is therefore quite identical to the first one, except that the starting point is not the signal $S(t)$ defined on N points but the product of convolution of $S(t)$ by $\Phi_0$ defined on N/2 points. The removal of one in every two points thus gives twice N/4 points.

For the following step, the N/4 points of the processing by $\Psi_0$ are memorized and the same computation is started again on the N/4 points coming from the convolution by $\Phi_0$. And so on.

At the step p, the method computes the products of convolution by $\Psi_0$ and $\Phi_0$ of the $N/2^{p-1}$ points coming from the convolution by $\Phi_0$ at the step $p-1$ by selecting one in two points, thus giving twice $N/2^p$.

It is thus seen that, at this step p, there are twice $N/2^p$ points available, coming from this step p, plus the N/2, N/4 etc. $N/2^{p-1}$ points memorized during the steps 1 to $p-1$, giving a total of N points that represent the analysis of the signal $S(t)$ by the wavelet $\Psi_0$ and the scale $\Phi_0$. There is therefore no redundancy in the set of coefficients obtained, which have been shown by MALLAT to represent $S(t)$ accurately.

This algorithm can continue, naturally, up to a step p such that $2^p = N$, but it has been observed experimentally that the coefficients thus obtained get stabilized very quickly at the end of a few steps, for example 5 to 6 steps. It is therefore possible to come to a stop very quickly in the successive computations, and this practice has been justified by proceeding to reconstruct the signal $S(t)$ on the basis of the N points obtained at the step p, by doing the reverse processing operation. It is noted that the signal $S(t)$ thus reconstituted is very similar to the initial signal once the coefficients are stabilized after 5 or 6 iterations as described further above.

When this analysis has been performed, what remains to be done is to use the N coefficients to obtain, for example, a classification of the analyzed signals. The problem is of the same nature as the one wherein, when the method of analysis into Fourier series is used, the origin of the analyzed signal is determined from the spectrum obtained. It is thus that the sound given out by a violin is distinguished from that given out by a saxophone, because these sounds do not have the same spectrum. It will be noted that these two instruments, taken as an example, can emit a continuous sound capable of being accurately analyzed by a Fourier series. In the case of a piano which gives out short notes, the use of a Fourier series is far less indicated and that of the analysis into wavelets would be far more worthwhile.

Different methods to interpret the coefficients of wavelets have been proposed. Thus, these coefficients may be introduced into a neuronal net which will perform the classification by a self-learning process. Another method consists in applying the signals to a display device XY. We thus obtain figures such as those shown in pages 35 and 36 of the article in POUR LA SCIENCE cited further above.

There is no way known, as yet, to identify these figures very well, and one of the problems that arises is that they take a tree shape which is relatively confused. This tree shape comes from the fact that, according to MALLAT's algorithms, we have a number of signals that decreases as and when the steps occur.

SUMMARY OF THE INVENTION

To overcome this drawback and obtain a set of homogeneous signals, the invention proposes a method for the analysis of a signal S(t) sampled at N points by a wavelet $\Psi_0$ and a scale $\Phi_0$, chiefly comprising the following steps:

a first step in which the convolutions of S(t) by $\Psi_0$ and $\Phi_0$ are done by sub-sampling the results of these convolutions by a factor of $\frac{1}{2}$ to obtain two first sets of N/2 points;

a second step in which the convolutions of each of these two first sets by $\Psi_0$ and $\Phi_0$ are done in sub-sampling the results of these convolutions by a factor of $\frac{1}{2}$ to obtain four second sets of N/4 points;

an arborescent iteration of these steps up to:

a $p^{th}$ step wherein the convolutions ($p_1 - p2p$) of each of the $2^{p-1}$ sets of the step p−1 by $\Psi_0$ and $\Phi_0$ are done by sub-sampling the results of these convolutions by a factor of $\frac{1}{2}$ to obtain a $2^{pth}$ set of $N/2^p$ points.

BRIEF DESCRIPTION OF THE DRAWINGS

Other particular features and advantages of the invention will appear clearly from the following description, given as a non-restrictive example, with reference to the appended figures, of which:

FIG. 5 is a table showing the values of the DAUBECHIES wavelets.

DESCRIPTION OF A PREFERRED EMBODIMENT

Figure 1:
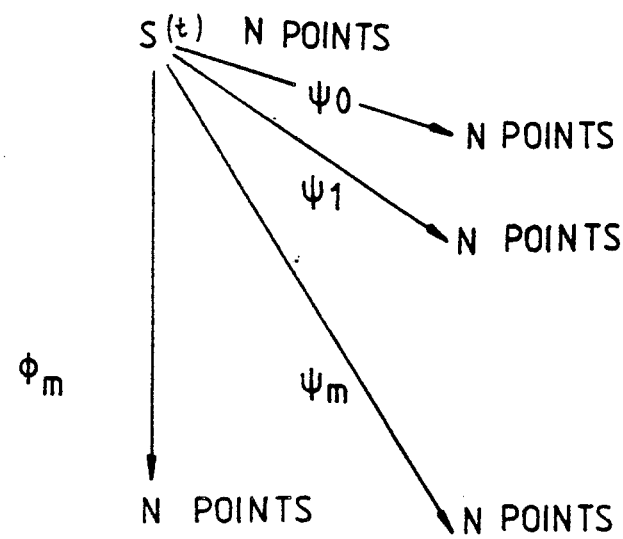
FIG. 1 shows the diagram of analysis into wavelets according to the bases of the theory of wavelets.
Figure 2:
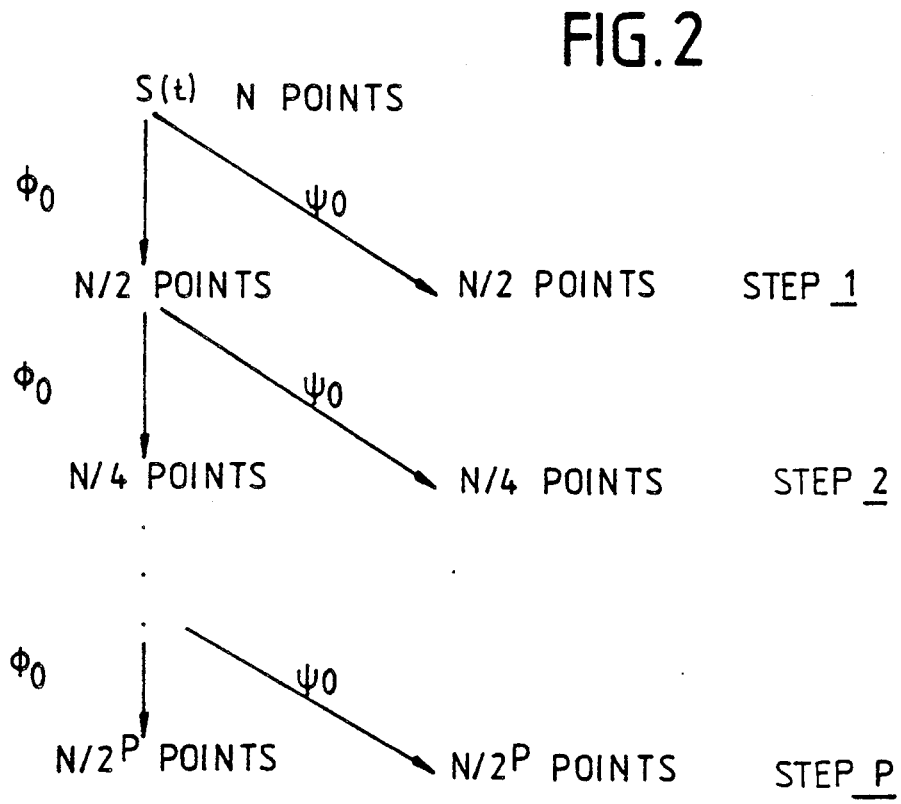
FIG. 2 shows a diagram of an analysis according to MALLAT's algorithm.
Figure 3:
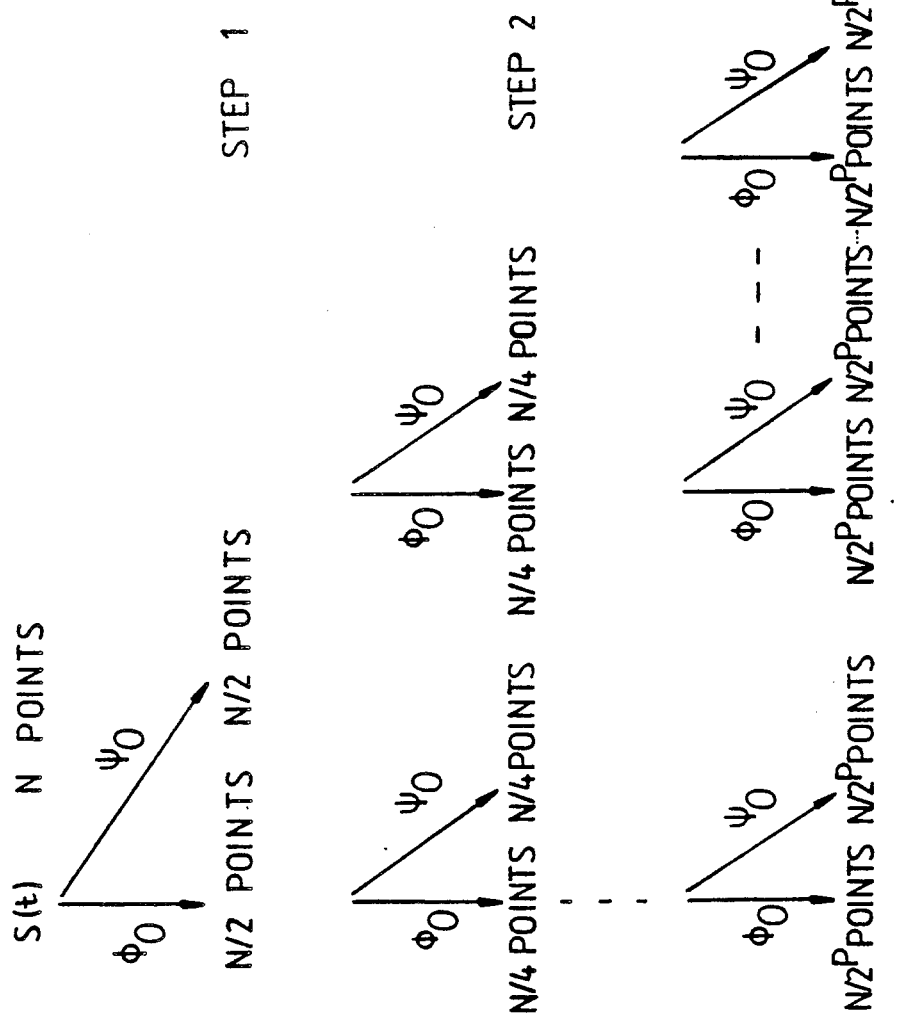
FIG. 3 shows a diagram of an analysis according to the invention.

FIG. 3, using the same conventions as for FIGS. 1 and 2, shows the analysis of a signal S(t) sampled on N points by the method according to the invention.

In a first step, identical to that of MALLAT's algorithm, a convolution of S(t) by $\Psi_0$ and $\Phi_0$ is done, and the number of points obtained is reduced by 2 to obtain N/2 points coming from the convolution by $\Psi_0$ and N/2 points from the convolution by $\Phi_0$. This reduction is equivalent to a sub-sampling.

In the second step, here again as in MALLAT's algorithm, a convolution by $\Psi_0$ and $\Phi_0$ is done on the N/2 points coming from the previous convolution by $\Phi_0$ but, instead of restricting this step at this point by memorizing the N/2 points of the convolution by $\Psi_0$ at the step 1, a convolution by $\Psi_0$ and $\Phi_0$ is also done on these N/2 points of the convolution by $\Psi_0$ in the step 1. We thus obtain four times N/4 points, coming from two convolutions by $\Psi_0$ and two convolutions by $\Phi_0$ on the twice N/2 points coming from the step 1, given the reduction by two of the number of points coming from the convolution, i.e., of course, given the restriction of the computations solely to those necessary.

In the following steps, this process is iterated to arrive at the step p wherein $2^{p-1}$ convolutions by $\Psi_0$ and $2^{p-1}$ convolutions by $\Phi_0$ are done on the $2^{p-1}$ times $N/2^{p-1}$ points coming from the steps p−1.

In all, therefore, at the end of the step p, we actually have N points coming from the analysis of the signal S(t) by the wavelet $\Psi_0$ and the scale $\Phi_0$. It is possible to limit the number of steps as a function of the same criteria as those used to apply MALLAT's algorithm.

It is noted that the distribution of these N points after the step p is homogeneous, thus making it possible to apply the corresponding signals, for example to a display device having $2^p$ rows and $N/2^p$ columns. All the points of a display device such as this are homogeneous a regards their meaning. This makes it easier to interpret the figures obtained and to classify them.

Figure 4:
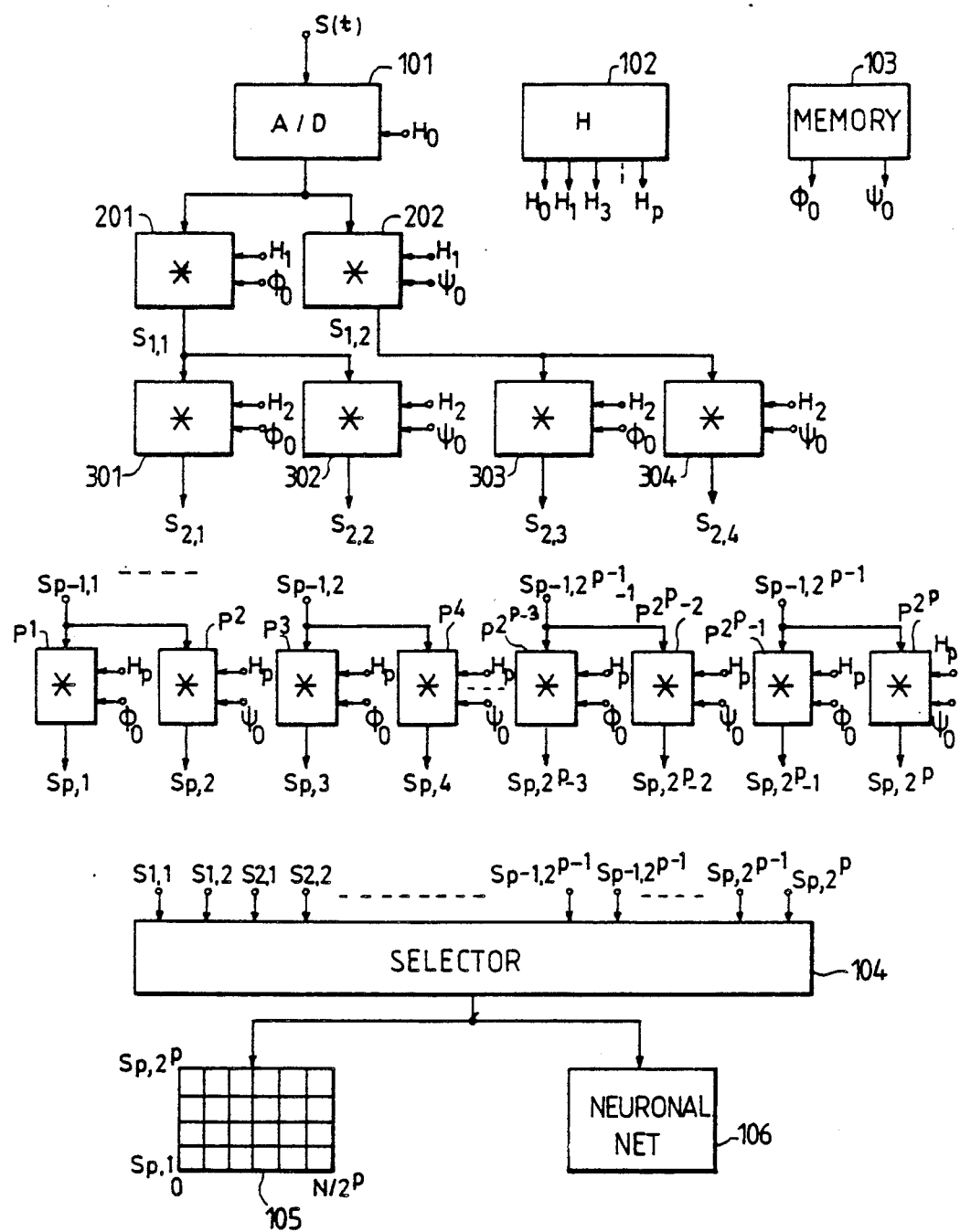
FIG. 4 shows the diagram of a device enabling the analysis according to the invention to be implemented.

FIG. 4 shows the diagram of a device enabling the analysis according to the invention to be implemented.

The signal S(t), which is assumed to be an analog signal, is applied to an analog/digital converter 101. This converter samples the signal S at a frequency $H_0$, determined by a clock circuit 102, and it then digitizes the samples thus obtained. The window at which the signal S will be sampled depends on the phenomena to be analyzed. For audible sound signals, it may be a window of the order of some tens of ms. The sampling frequency will then be, for example, some tens of KHz and the scale of digitization will cover, for example, 14 binary elements.

The signal thus sampled/digitized is then convoluted in two convolution devices, 201 and 202 respectively, with the wavelet $\Psi_0$ signal and the scale $\Phi_0$ signal. These signals form an orthogonal base with compact support and are preferably those of the wavelets of DAUBECHIES which are represented by continuous values in the table in FIG. 5 (limited to an order of 10). The digital values given in this table are memorized in a memory 103 which delivers them to the circuits 201 and 202. These circuits also receive clock signals $H_1$ delivered by the circuit 102 which are at half the frequency of $H_0$ in order to obtain a sampling of the signals convoluted at the frequency which is half of the signal S(t) sampling frequency, as was explained further above.

The signals $S_{1,1}$ delivered by the circuit 201 are then applied to two convolution circuits 301 and 302 which work exactly in the same way as the circuits 201 and 202, but under actuation by a clock signal $H_2$ given by the circuit 102 at the half of the frequency of the signal $H_1$, and hence at $\frac{1}{4}$ of the frequency of the signal $H_0$. In the same way, the signal $S_{1,2}$ given by the circuit 202 is given to two circuits 303 and 304 which work like the circuits 301 and 302, also by the clock signal $H_2$.

The device then develops in a tree pattern according to the same relationship to reach a stage p having $2^p$ convolution circuits $p_1$ to $p_{2p}$ that are identical to the base circuits 201 and 202. These circuits receive the signals coming from the preceding stage two by two, and also receive the wavelet signals from the circuit 103 and a clock signal $H_p$ at the frequency $\frac{1}{2^p}$ with respect to the frequency of the clock signal $H_0$. At the output of this stage, we thus obtain the signals $S_{p,1}$ to $S_{p,2p}$.

The set of signals $S_{1,1}$ to $S_{p,2p}$ leaving by all the stages is applied to a selector 104 which enables the selection of the depth of the analysis, namely the stage a which the results obtained by the analysis will be studied. This selector enables the selection of all the signals corresponding to a stage, namely, for example, $S_{1,1}$ and $S_{1,2}$ or $S_{p,1}$ to $S_{p,2p}$. For, as we have seen further above, the operation of analysis quickly becomes stationary, and then the processing does not need to be taken any further: this is useful since the products of convolution correspond to relatively lengthy computations.

The signals thus selected may be applied to different interpreting instruments. FIG. 4 shows a simple interpreting instrument 105 which is a simple display device having $2^P$ rows and $N/2^P$ columns. The signals are applied to the rows and their variation along along the columns corresponds to a time scale which is that of the window of analysis of the signal S(t) divided into $N/2^P$ points. Depending on the chosen depth of selection, one and the same signal could be applied to several rows, since their number is designed to apply the maximum number of signals delivered by the stage p.

In another example, the signals are applied to a neuronal net 106. This net, as is known, gets configured automatically, according to a self-learning system as and when analysis signals are applied to it. After having received a certain number of signals, corresponding to different classes of signals S(t) analyzed, the neuronal net will give a response enabling the classification of any subsequently analyzed signal S(t) under one of the various categories resulting precisely from the self-learning of the neuronal net.

As can be seen, the only computational operation performed in this device is a product of convolution and the results are obtained by the combination of these products as well as, of course, by the use of the wavelet coefficients and of the appropriate clock frequencies. It is therefore quite possible, as a variant, to use a smaller number of convolution circuits such as 201 and 202 and, ultimately, even just one of these circuits, in applying the necessary signals to it by means of a set of appropriate change-over switches obtained, for example, by means of a combinational circuit. These signals are, firstly, the previous results, suitably memorized and, secondly, the wavelet signals given at request by the memory 103 as well as the clock signals which too are given at request by the circuit 102. The processing periods will, of course, be substantially lengthier and the signals for one and the same depth of analysis will not all be available at the same instant since they will be gradually memorized in the intermediate memory. On the other hand, the volume of the material used will be smaller.

Under these conditions, and as another alternative embodiment, it is possible to use a standard computer suitably programmed to perform all these operations.

The convolution product in itself is a computation commonly performed in a computer with programs that exist in the market, and the sequence of successive processing operations may be obtained by adequate programming, wherein the intermediate results are stored in memory to be brought out again when they are necessary. In the same way, the coefficients of wavelets are placed in the central memory of the computer and, in the sequence of operations, there is provision for obtaining the product of convolution on the number of points needed for the rate of the analysis operation. Although the analog/digital conversion too can be done in the computer, it is nevertheless desirable to use a specialized circuit, which will be faster, for this function. It is also possible to use a specialized circuit to perform the convolution, here again for reasons of speed, since many micro-computers provide for the use of a co-processor associated with the microprocessor in order to make particular computations.

What is claimed is:

1. A device for analysis by wavelets, comprising:
   an analog/digital converter enabling sampling and digitization of N points of an incoming signal S(t);
   a clock circuit enabling delivery of a clock signal $H_0$ at a sampling frequency to said converter, and clock signals $H_1-H_p$, corresponding sampling frequencies of which are submultiples of two of the sampling frequency of the clock signal $H_0$;
   a memory circuit enabling memorizing and delivery of wavelet $\Psi_0$ and scale $\Phi_0$ signals; and
   p sets of convoluters, a first set having two convoluters which receive and convolute said sampled and digitized incoming signal S(t) using said $H_1$, $\Psi_0$ and $\Phi_0$ signals and output a first pair of convoluted signals, and sets j for $j \geq 2$ each including $2^j$ convoluters receiving, two by two, respectively $2^{j-1}$ convoluted signals output by an order j−1 set, using the signals $\Psi_0$ and $\Phi_0$ and a clock signal $H_j$;
   selection means for receiving all the convoluted signals from the convoluters and selecting at least one of the convoluted signals from the convoluters; and
   means for interpreting the signals thus selected.

2. A device according to claim 1, wherein the interpretation means comprises a display device including $2^p$ rows and $N^p$ columns.

3. A device according to claim 1, wherein the interpretation means comprises a neuronal net.

4. A device for analysis by wavelets of an input signal, comprising:
   a convoluter;
   a first memory circuit for storing and delivering signals $\Psi_0$ and $\Phi_0$ to said convoluter;
   a clock circuit for delivering a clock signal $H_0$ at a sampling frequency, and clock signals $H_1-H_p$ having
   wherein the convoluter convolutes said input signal using said $\Psi_0$, $\Phi_0$ and clock signals $H_0-H_p$, said intermediate computations of said convolution being stored by said second memory circuit, and produces a plurality of convoluted signals, at least one of said plurality of convoluted signals being selected by said selection circuit, thereby said convoluter performs all convolution computations of a multiple-stage convoluter.

5. A device according to claim 4, further comprising:
   interpretation circuits formed by a display device including $2^p$ rows and $N^p$ columns for interpreting said at least one convoluted signal selected by said selection circuit.

6. A device according to claim 4, further comprising an interpretation circuit including a neuronal net for interpreting said at least one convoluted signal selected by said selection circuit.

* * * * *